United States Patent
Harada

(10) Patent No.: US 11,810,970 B2
(45) Date of Patent: Nov. 7, 2023

(54) SEMICONDUCTOR DEVICE AND A MANUFACTURING METHOD OF SEMICONDUCTOR DEVICE

(71) Applicant: Mitsubishi Electric Corporation, Tokyo (JP)

(72) Inventor: Tatsuo Harada, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 164 days.

(21) Appl. No.: 17/398,577

(22) Filed: Aug. 10, 2021

(65) Prior Publication Data
US 2022/0254908 A1 Aug. 11, 2022

(30) Foreign Application Priority Data
Feb. 5, 2021 (JP) .................. 2021-017636

(51) Int. Cl.
| | |
|---|---|
| H01L 29/739 | (2006.01) |
| H01L 29/16 | (2006.01) |
| H01L 29/20 | (2006.01) |
| H01L 29/66 | (2006.01) |
| H01L 29/423 | (2006.01) |
| H01L 29/40 | (2006.01) |
| H01L 29/10 | (2006.01) |

(52) U.S. Cl.
CPC ...... *H01L 29/7397* (2013.01); *H01L 29/1095* (2013.01); *H01L 29/1602* (2013.01); *H01L 29/1608* (2013.01); *H01L 29/2003* (2013.01); *H01L 29/401* (2013.01); *H01L 29/4236* (2013.01); *H01L 29/6631* (2013.01); *H01L 29/66045* (2013.01); *H01L 29/66068* (2013.01)

(58) Field of Classification Search
CPC ............. H01L 29/7397; H01L 29/1095; H01L 29/1602; H01L 29/1608; H01L 29/2003; H01L 29/401; H01L 29/4236; H01L 29/66045; H01L 29/66068; H01L 29/6631
USPC .......................................................... 257/77
See application file for complete search history.

(56) References Cited

U.S. PATENT DOCUMENTS

| | | | |
|---|---|---|---|
| 6,137,135 A | 10/2000 | Kubo et al. | |
| 6,191,447 B1* | 2/2001 | Baliga ................. | H01L 29/8725 257/330 |

(Continued)

FOREIGN PATENT DOCUMENTS

JP H11-111983 A 4/1999

*Primary Examiner* — Igwe U Anya
(74) *Attorney, Agent, or Firm* — Studebaker & Brackett PC

(57) ABSTRACT

A semiconductor device includes a substrate, a drift layer provided on an upper surface side of the substrate, a base layer provided on the upper surface side of the drift layer, an upper semiconductor layer provided on the upper surface side of the base layer, a first electrode provided on the upper surface of the substrate, a second electrode provided on a rear surface of the substrate, a trench extending to the drift layer from the upper surface of the substrate and a gate electrode provided inside the trench, wherein an inner side surface of the trench has a first surface and a second surface provided below the first surface, the second surface tilts inward of the trench with respect to the first surface, and an intersection point of the first surface and the second surface is provided below the base layer.

13 Claims, 14 Drawing Sheets

(56) References Cited

U.S. PATENT DOCUMENTS

| | | | |
|---|---|---|---|
| 7,385,248 B2* | 6/2008 | Herrick | H01L 29/66727 |
| | | | 257/E29.2 |
| 2017/0077274 A1* | 3/2017 | Naito | H01L 29/4236 |
| 2018/0350975 A1* | 12/2018 | Kojima | H01L 29/7813 |

* cited by examiner

SEMICONDUCTOR DEVICE AND A MANUFACTURING METHOD OF SEMICONDUCTOR DEVICE

BACKGROUND OF THE INVENTION

Field

The present disclosure relates to a semiconductor device and a manufacturing method of the semiconductor device.

BACKGROUND

JP H11-111983 A discloses a trench-type vertical metal-oxide semiconductor field-effect transistor (MOSFET). This MOSFET includes a trench which becomes a gate and which has a convex shape like a character of γ directed inward of the trench. This results in reducing a surface area of the trench and can reduce capacity between the gate and source and between the gate and a drain, so that it is possible to shorten a switching time.

In a semiconductor device in JP H11-111983, the trench has a γ shape, and thus, tilt occurs at portions where channels are provided, which may result in increase in variation in a saturated current.

SUMMARY

The present disclosure has been made to solve the above-described problem and is directed to providing a semiconductor device which is capable of reducing variation in a saturated current, and a manufacturing method of the semiconductor device.

The features and advantages of the present disclosure may be summarized as follows.

According to an aspect of the present disclosure, a semiconductor device includes a substrate including an upper surface and a rear surface on an opposite side of the upper surface, a drift layer provided on the upper surface side of the substrate and having a first conductivity type, a base layer provided on the upper surface side of the drift layer and having a second conductivity type different from the first conductivity type, an upper semiconductor layer provided on the upper surface side of the base layer and having the first conductivity type, a first electrode provided on the upper surface of the substrate and electrically connected to the upper semiconductor layer, a second electrode provided on the rear surface of the substrate, a trench penetrating through the upper semiconductor layer and the base layer from the upper surface of the substrate and extending to the drift layer and a gate electrode provided inside the trench, wherein an inner side surface of the trench has a first surface and a second surface provided below the first surface, the second surface tilts inward of the trench with respect to the first surface, and an intersection point of the first surface and the second surface is provided below the base layer.

According to an aspect of the present disclosure, a manufacturing method of the semiconductor device includes forming a drift layer having a first conductivity type on an upper surface side of a substrate which includes the upper surface and a rear surface on an opposite side of the upper surface, forming a base layer having a second conductivity type different from the first conductivity type on the upper surface side of the drift layer, forming an upper semiconductor layer having the first conductivity type on the upper surface side of the base layer, forming a first trench extending to a depth below the base layer from the upper surface of the substrate through etching, performing etching from a bottom portion of the first trench to form a second trench under at least one of a condition that a pressure of an etching gas is made higher than a pressure of an etching gas upon formation of the first trench, a condition that an applied voltage of an ion to be used for etching is made lower than an applied voltage of an ion upon formation of the first trench, or a condition that a by-product generated in association with etching is made more likely to be deposited than a by-product generated upon formation of the first trench, forming a first electrode electrically connected to the upper semiconductor layer on the upper surface of the substrate, forming a second electrode on the rear surface of the substrate and forming a gate electrode inside a trench formed from the first trench and the second trench.

Other and further objects, features and advantages of the disclosure will appear more fully from the following description.

DESCRIPTION OF EMBODIMENTS

Figure 1:
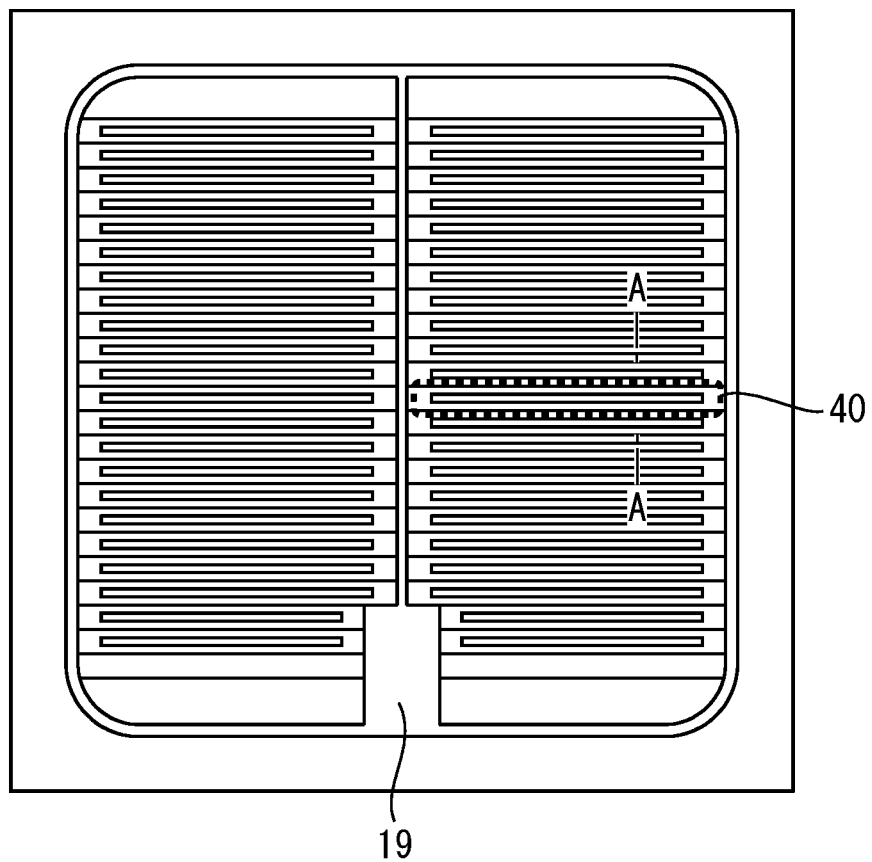
FIG. 1 is a plan view of a semiconductor device according to a first embodiment.

Semiconductor devices and manufacturing methods of the semiconductor devices according to embodiments of the present disclosure will be described with reference to the accompanying drawings. Components identical or corresponding to each other are indicated by the same reference characters, and repeated description of them is avoided in some cases.

First Embodiment

Figure 2:
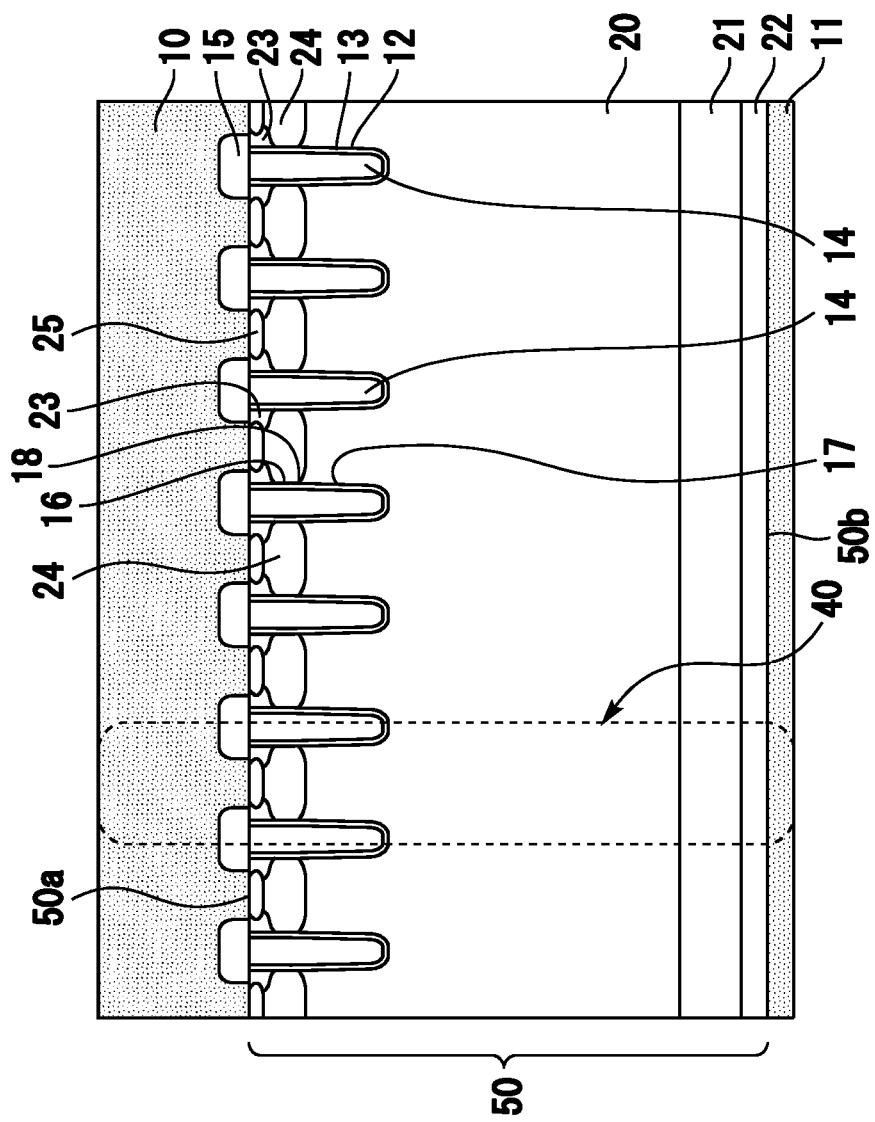
FIG. 2 is a cross-sectional diagram obtained by cutting FIG. 1 along a line A-A.

FIG. 1 is a plan view of a semiconductor device 100 according to a first embodiment. FIG. 2 is a cross-sectional diagram obtained by cutting FIG. 1 along a line A-A. The semiconductor device 100 is, for example, an insulated gate bipolar transistor (IGBT). The semiconductor device 100 is used as, for example, a power semiconductor apparatus.

The semiconductor device 100 includes a substrate 50 which includes an upper surface 50a and a rear surface 50b on an opposite side of the upper surface 50a. The substrate 50 is an n-type and is formed with, for example, Si. The n-type corresponds to a first conductivity type, and a p-type corresponds to a second conductivity type. A conductivity type of each layer may be opposite.

An n-type drift layer 20 is provided on the upper surface 50a side of the substrate 50. A p-type base layer 24 is provided on the upper surface 50a side of the drift layer 20. An n-type emitter layer 23 is provided on the upper surface 50a side of the base layer 24. The emitter layer 23 corresponds to an upper semiconductor layer. A p-type contact layer 25 is provided on the upper surface 50a side of the base layer 24. The emitter layer 23 and the contact layer 25 are each formed at part on the upper surface 50a side of the base layer 24.

An n-type buffer layer 21 is formed on the rear surface 50b side of the substrate 50. A p-type collector layer 22 is formed on the rear surface 50b side of the buffer layer 21.

Trenches 12 are formed in the substrate 50. The trenches 12 penetrate through the emitter layer 23 and the base layer 24 from the upper surface 50a of the substrate 50 and extend to the drift layer 20. Inner side surfaces of the trenches 12 are covered with gate insulator films 13. Gate electrodes 14 are buried inside the trenches 12 via the gate insulator films 13. Interlayer insulating films 15 cover upper surfaces of the gate electrodes 14. The gate electrodes 14 are electrically connected to a gate pad 19 illustrated in FIG. 1.

A plurality of cell regions 40 are formed in the substrate 50. Each cell region 40 includes the emitter layer 23, the base layer 24, the contact layer 25, the gate electrode 14 and the interlayer insulating film 15. An emitter electrode 10 which is electrically connected to the emitter layer 23 is provided on the upper surface 50a of the substrate 50. The emitter electrode 10 corresponds to a first electrode. The emitter electrode 10 is formed on a plurality of cell regions 40. The emitter electrode 10 is connected to the emitter layer 23, the base layer 24 and the contact layer 25. The gate electrodes 14 are insulated from the emitter electrode 10 by the interlayer insulating films 15. A collector electrode 11 is formed on the rear surface 50b of the substrate 50. The collector electrode 11 corresponds to a second electrode.

Figure 3:
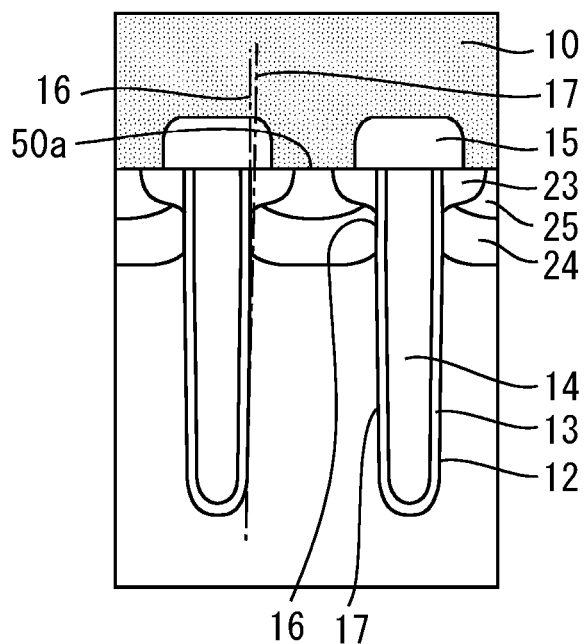
FIG. 3 is an enlarged view of FIG. 2.
Figure 4:
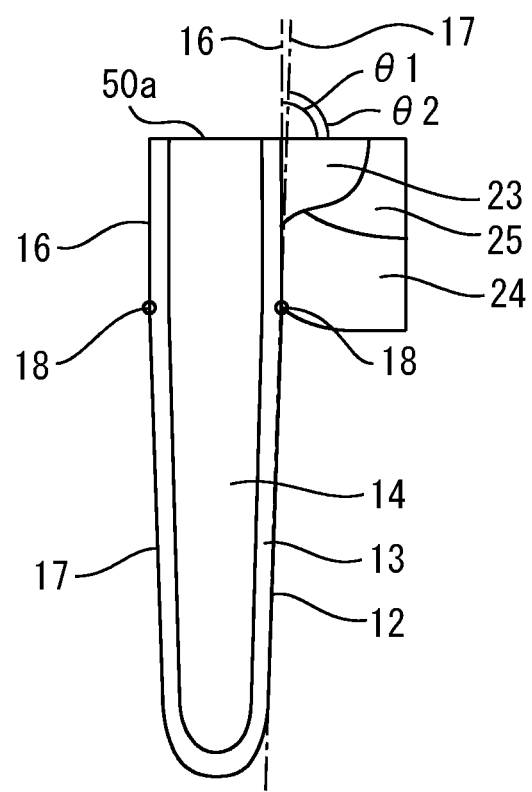
FIG. 4 is an enlarged view of a portion around the trench according to the first embodiment

FIG. 3 is an enlarged view of FIG. 2. FIG. 4 is an enlarged view of a portion around the trench 12 according to the first embodiment. A width of the trench 12 becomes narrower downward. The inner side surface of the trench 12 has a first surface 16 and a second surface 17 provided below the first surface 16. The second surface 17 tilts inward of the trench 12 with respect to the first surface 16. In FIG. 4, as an example, an intersection point 18 of the first surface 16 and the second surface 17 is positioned at the same depth as a depth of a lower end of the base layer 24. In other words, the intersection point 18 is positioned at the same depth as a depth of a lower end of a channel dope. The intersection point 18 of the first surface 16 and the second surface 17 may be provided below the base layer 24. Further, the trench 12 has a bottom surface which is formed with a curve surface and which has an arch shape. A corner portion which connects the bottom surface of the trench 12 and the second surface 17 is rounded.

As illustrated in FIG. 4, an angle θ2 formed by the second surface 17 and the upper surface 50a of the substrate 50 is smaller than an angle θ1 formed by the first surface 16 and the upper surface 50a of the substrate 50. In other words, a decrease amount of a width per unit depth of the trench 12 is larger below the intersection point 18 than a decrease amount of a width per unit depth of the trench 12 above the intersection point 18.

Figure 5:
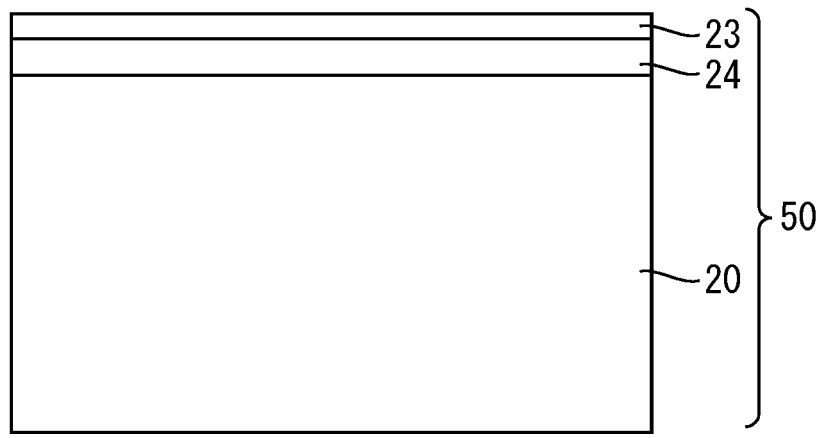
FIG. 5 is a view illustrating a state where the drift layer, the base layer and the emitter layer are formed in the substrate.

A manufacturing method of the semiconductor device 100 will be described next. First, the drift layer 20 is formed on the upper surface 50a side of the substrate 50, the base layer 24 is formed on the upper surface 50a side of the drift layer 20, and the emitter layer 23 is formed on the upper surface 50a side of the base layer 24. FIG. 5 is a view illustrating a state where the drift layer 20, the base layer 24 and the emitter layer 23 are formed in the substrate 50. The base layer 24 and the emitter layer 23 can be formed using a technology such as ion implantation. Order of forming the drift layer 20, the base layer 24 and the emitter layer 23 is not limited.

Figure 6:
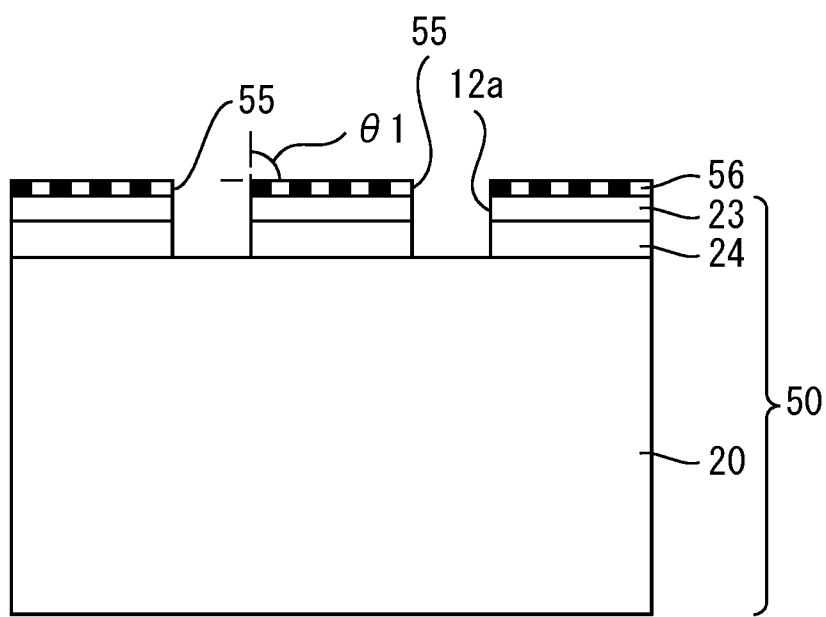
FIG. 6 is a view illustrating a state where the substrate is etched.

Then, a mask 56 having an opening 55 is formed on an upper surface of the emitter layer 23. Then, dry etching is performed using the mask 56 to form a first trench 12a. FIG. 6 is a view illustrating a state where the substrate 50 is etched. The first trench 12a continues, for example, to a lower end of the base layer 24. A depth of the first trench 12a differs depending on a final depth of the trench 12. For example, in a case where the final depth of the trench 12 is 5.0 μm, the depth of the first trench 12a becomes a depth to the lower end of the base layer 24. Further, the first trench 12a may be formed through etching so as to extend to a depth below the base layer 24 from the upper surface 50a of the substrate 50.

A side surface of the first trench 12a is substantially perpendicular to the upper surface 50a of the substrate 50. An angle θ1 formed by an inner side surface of the first trench 12a and the upper surface 50a of the substrate 50 is, for example, equal to or greater than 89°. The angle θ1 can be controlled by adjusting a pressure of an etching gas during dry etching or an applied voltage of ion to be used for etching. Further, the angle θ1 can be controlled by adjusting a deposition condition of by-product generated in association with etching. For example, by-product is more likely to be deposited if a carbon ratio in a gas is made higher. Specifically, the angle θ1 can be made larger as a pressure of the etching gas is lower or the applied voltage of the ion is higher. Further, the angle θ1 can be made larger in a condition where less by-product is generated in association with etching.

Figure 7:
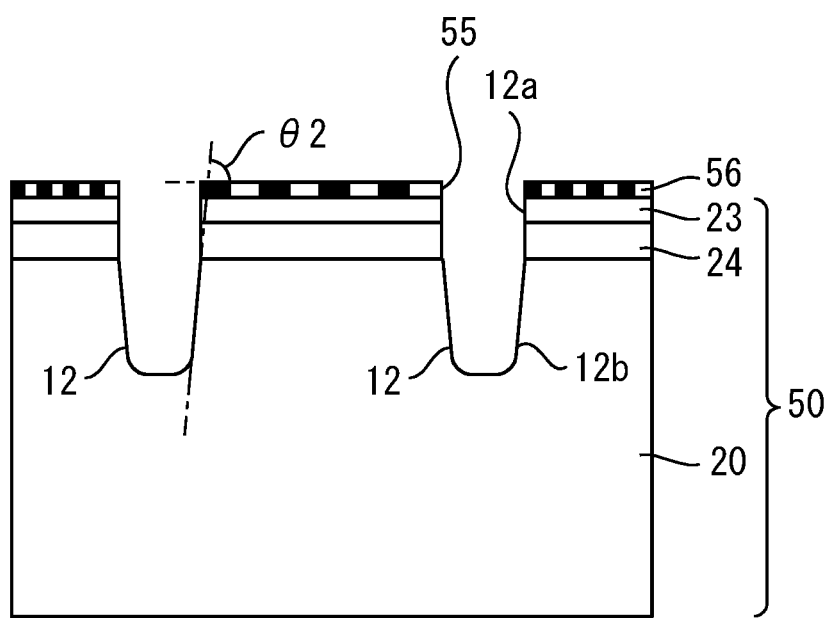
FIG. 7 is a view illustrating a state where etching is performed from the bottom portion of the first trench to form the second trench.

Then, dry etching is performed from a bottom portion of the first trench 12a to form a second trench 12b. FIG. 7 is a view illustrating a state where etching is performed from the bottom portion of the first trench 12a to form the second trench 12b. An inner side surface of the second trench 12b tilts more largely with respect to the upper surface 50a of the substrate 50 than the inner side surface of the first trench 12a tilts. An angle θ2 formed by the inner side surface of the second trench 12b and the upper surface 50a of the substrate 50 is, for example, equal to or less than 88°.

Etching is performed to form the second trench 12b on a condition which can control the angle θ2 to be smaller compared to a condition when etching is performed to form the first trench 12a. Etching for forming the second trench 12b is performed with an etching gas whose pressure is, for example, made higher than the pressure of the etching gas when the first trench 12a is formed. Further, etching for forming the second trench 12b may be performed with a more lowered applied voltage of ion to be used for etching compared to an applied voltage of ion when the first trench 12a is formed. Further, etching for forming the second trench 12b may be performed on a condition in which a by-product generated in association with etching is more likely to be deposited than a by-product generated when the first trench 12a is formed. An etching condition for forming the second trench 12b only requires to include at least one of these three conditions.

In this manner, the first trench 12a and the second trench 12b in the present embodiment are formed with different etching conditions. The trench 12 only requires to be formed at least at or after a step in which the base layer 24 is formed in the substrate 50. Then, an oxide film is formed on an inner wall of the trench 12 as the gate insulating film 13. Then, gate polysilicon is formed on the gate insulating film 13 as the gate electrode 14 inside the trench 12. The gate electrode 14 is formed inside the trench 12 in this manner. Further, the emitter electrode 10 is formed on the upper surface 50a of the substrate 50, and the collector electrode 11 is formed on the rear surface 50b of the substrate 50.

Figure 8:
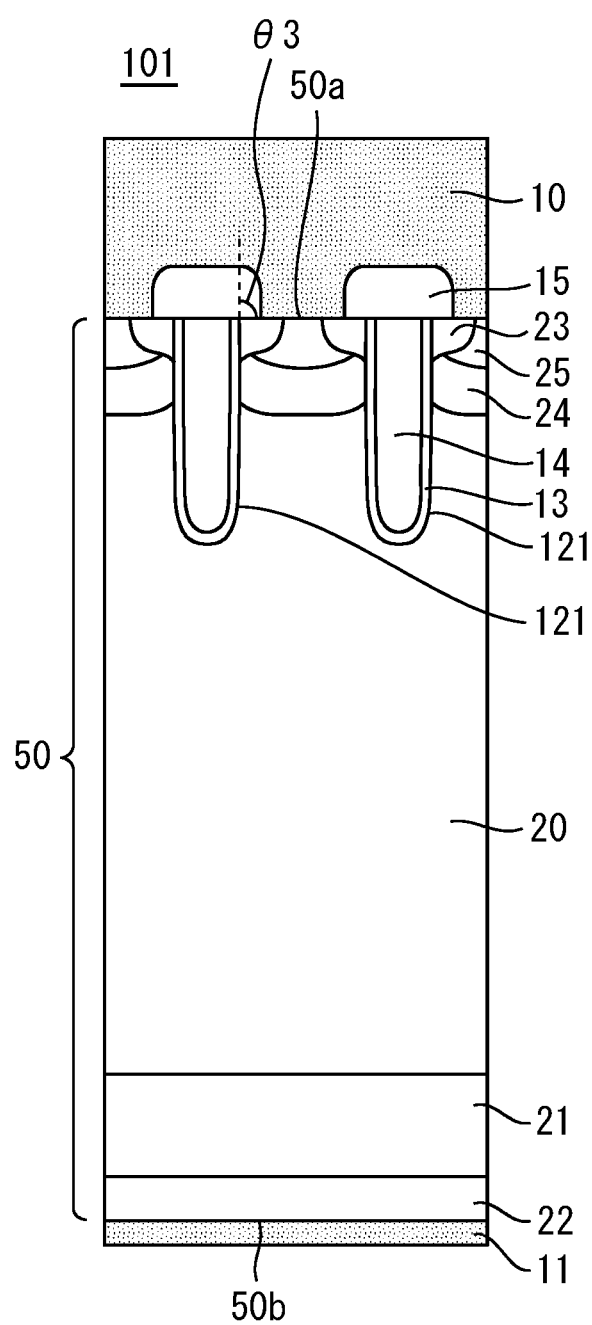
FIG. 8 is a cross-sectional diagram of a semiconductor device according to a first comparative example.
Figure 9:
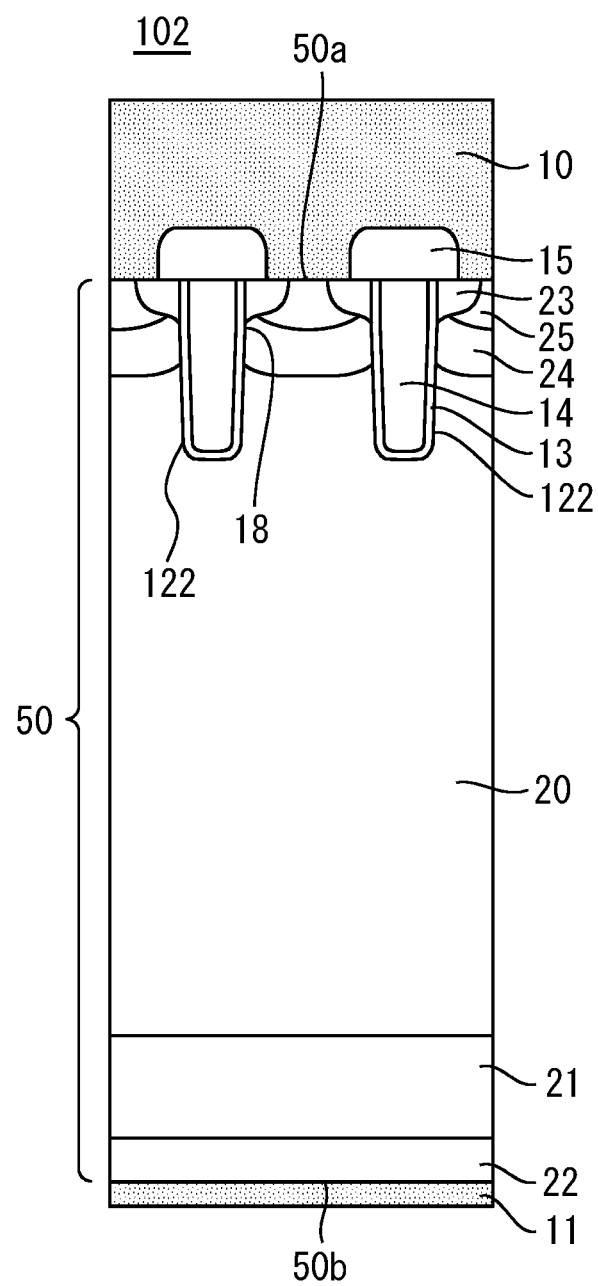
FIG. 9 is a cross-sectional diagram of a semiconductor device according to a second comparative example.
Figure 10:
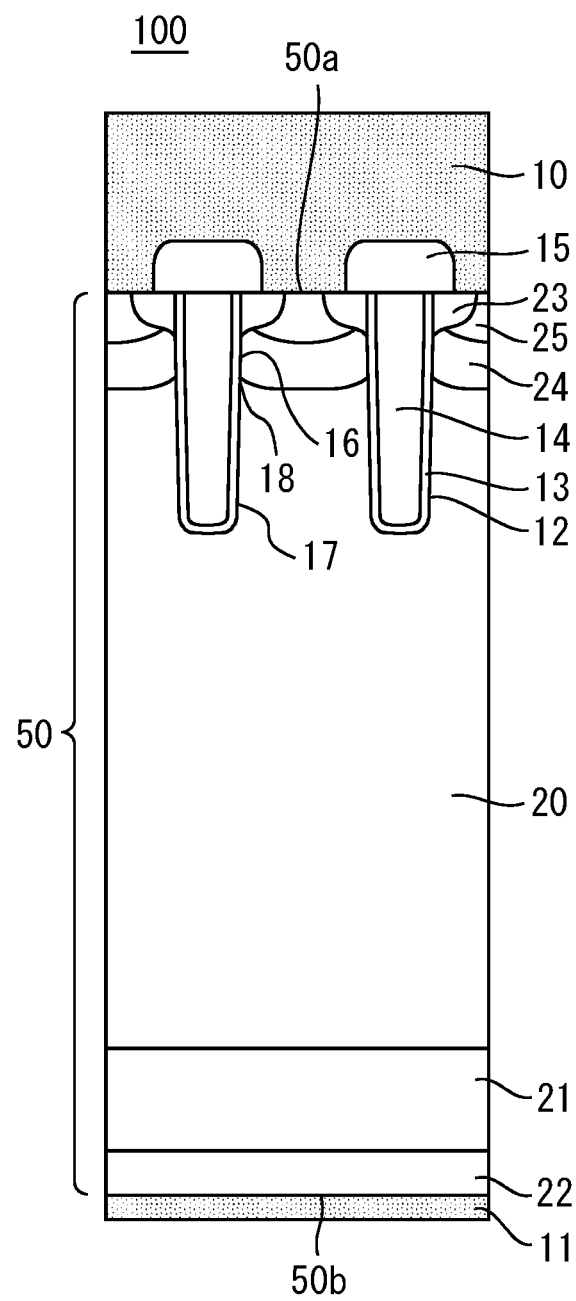
FIG. 10 is a cross-sectional diagram of the semiconductor device according to the first embodiment.

Effects of the present embodiment will be described next while comparing the present embodiment with comparative examples. FIG. 8 is a cross-sectional diagram of a semiconductor device 101 according to a first comparative example. FIG. 9 is a cross-sectional diagram of a semiconductor device 102 according to a second comparative example. FIG. 10 is a cross-sectional diagram of the semiconductor device 100 according to the first embodiment. In the semiconductor device 101 according to the first comparative example, the whole of an inner side surface of a trench 121 tilts with a constant angle. Further, in the semiconductor device 102 according to the second comparative example, an intersection point 18 on an inner side surface of a trench 122 is provided at a position shallower than a position in the present embodiment. The intersection point 18 at the trench 122 is, for example, provided at the same depth as a depth of a lower end of the emitter layer 23. A depth of the trench 121 and the trench 12 of the present embodiment is, for example, 5.8 μm, and a depth of the trench 122 is 3.8 μm.

Figure 11:
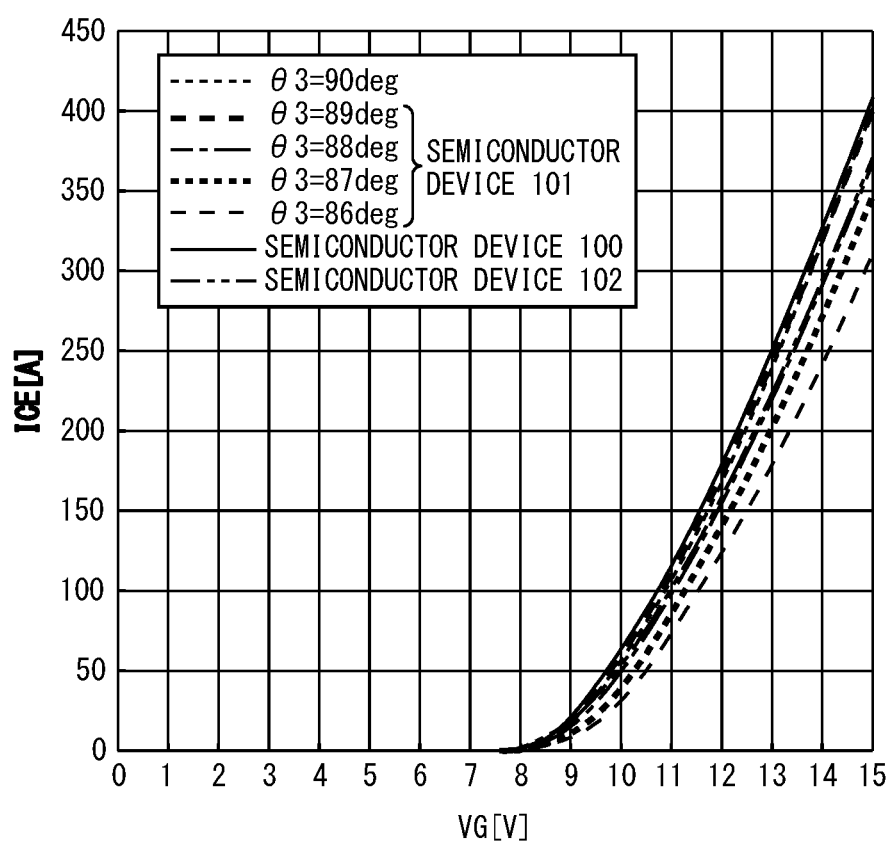
FIG. 11 is a characteristic diagram illustrating dependency of a collector current on a gate voltage.

FIG. 11 is a characteristic diagram illustrating dependency of a collector current on a gate voltage. In FIG. 11, ICE in a case where Vg is up to 15 V is compared for the semiconductor devices 100, 101 and 102. In FIG. 11, a gate voltage VG represents forward bias to the gate electrode 14. Further, a collector current ICE represents a current flowing from the collector electrode 11 to the emitter electrode 10.

In the semiconductor device 101 according to the first comparative example, a saturated current more decreases as an angle θ3 formed by the upper surface 50a of the substrate 50 and the inner side surface of the trench 121 becomes smaller. Variation in the saturated current is approximately 30% in a range where the angle θ3 is 86° to 89°. In contrast, in the semiconductor device 100 of the present embodiment, a collector current which is larger than a collector current in a U-shaped trench indicated with θ3=90° and the semiconductor devices 101 and 102 can be obtained.

Typically, in the U-shaped trench indicated with θ3=90°, feedback capacity more increases as a depth of the trench becomes deeper. Further, there is a case where it is more difficult to maintain a U-shape as the depth of the trench becomes deeper. Further, in a case where the trench 121 according to the first comparative example tilts in a level equal to or greater than a certain level, a channel length tends to be longer, and there is a possibility that a tilt angle of the trench 121 may vary. As illustrated in FIG. 11, if the tilt angle of the trench 121 varies, there is a possibility that the saturated current may largely vary.

In an IGBT, in a case where forward bias is applied to the collector electrode 11 and the gate electrodes 14, an inversion layer is generated in the base layer 24 which contacts the gate insulating films 13, and a channel is formed. This starts energization from the collector electrode 11 to the emitter electrode 10 and turns on the IGBT. If a length of the channel is not stable, energization performance varies in a state where high forward bias is applied to the gate electrodes 14. This may introduce increase of an ON voltage, increase of ON characteristics upon switching, decrease in short circuit tolerance, or the like. Particularly, in a case where a plurality of chips are connected in parallel and used, there is a possibility that a current upon energization may vary. There is a possibility that this may decrease tolerance of a safety operating area (SOA).

In contrast, in the semiconductor device 100 of the present embodiment, the first surface 16 which contacts the base layer 24 in the trench 12 is substantially perpendicular to the upper surface 50a of the substrate 50. It is therefore possible to maintain the channel length short and further reduce variation in a tilt angle of the first surface 16, so that it is possible to reduce variation in the channel length. It is therefore possible to reduce variation in energization performance upon application of high forward bias to the gate electrodes 14. In other words, it is possible to reduce variation in the saturated current. Further, it is possible to reduce variation in a threshold voltage, so that it is possible to reduce an ON voltage and achieve improvement of short circuit tolerance. Further, also in a case where a plurality of semiconductor devices 100 are connected in parallel, it is possible to reduce variation in a current, so that it is possible to prevent concentration of a current at a chip at which a current is likely to flow in the SOA and increase tolerance.

The angle θ1 formed by the first surface 16 and the upper surface 50a of the substrate 50 at the trench 12 is preferably greater than 89° and equal to or less than 90°. As illustrated in FIG. 11, in this angle range, the collector current dependent on the angle θ1 less fluctuates, so that it is possible to reduce variation in the collector current. Further, the angle θ2 formed by the second surface 17 and the upper surface 50a of the substrate 50 is preferably greater than 86° and equal to or less than 88°. This can maintain a round shape of the bottom portion of the trench 12 particularly at the trench 12 having a deep depth of 6 μm, or the like. This can prevent concentration of an electric field upon application of a voltage, so that it is possible to prevent decrease in a withstand voltage.

Figure 12:
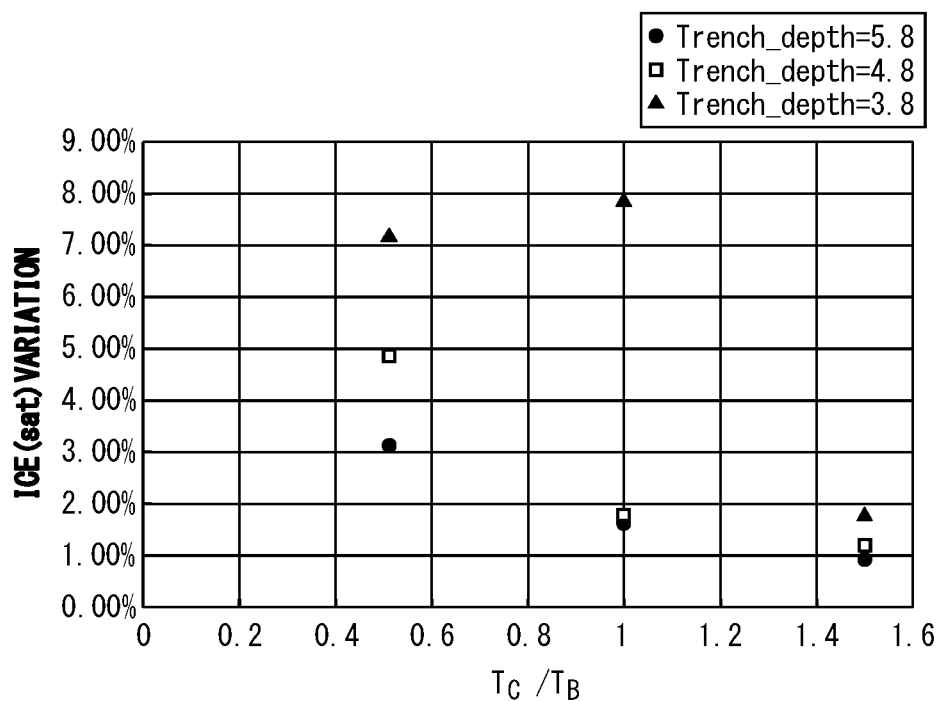
FIG. 12 is a correlation diagram of a ratio of a depth $T_C$ of the intersection point with respect to a depth $T_B$ of the base layer, and variation in the collector current.

FIG. 12 is a correlation diagram of a ratio of a depth $T_C$ of the intersection point 18 with respect to a depth $T_B$ of the base layer 24, and variation in the collector current. The depth $T_B$ indicates a depth from the upper surface 50a of the substrate 50 to a lower end of a portion adjacent to the trench 12, of the base layer 24. In other words, the depth $T_B$ corresponds to a value obtained by adding a width of the emitter layer 23 facing a side wall of the trench 12 and a length of a channel formed in the base layer 24. The depth $T_C$ indicates a depth from the upper surface 50a of the substrate 50 to the intersection point 18.

FIG. 12 indicates relationship between $T_C/T_B$ and variation in the saturated current in a case where the depth of the trench 12 is 5.8 μm, 4.8 μm and 3.8 μm. Variation in the saturated current is larger as the trench 12 is shallower. However, even in a structure in which the depth of the trench 12 is 3.8 μm, by setting $T_C/T_B$ at, for example, a value greater than 1, it is possible to reduce variation in the saturated current. In other words, by positioning the intersection point 18 of the first surface 16 and the second surface 17 below the base layer 24, it is possible to reduce variation in the saturated current also in a shallow trench 12.

Figure 13:
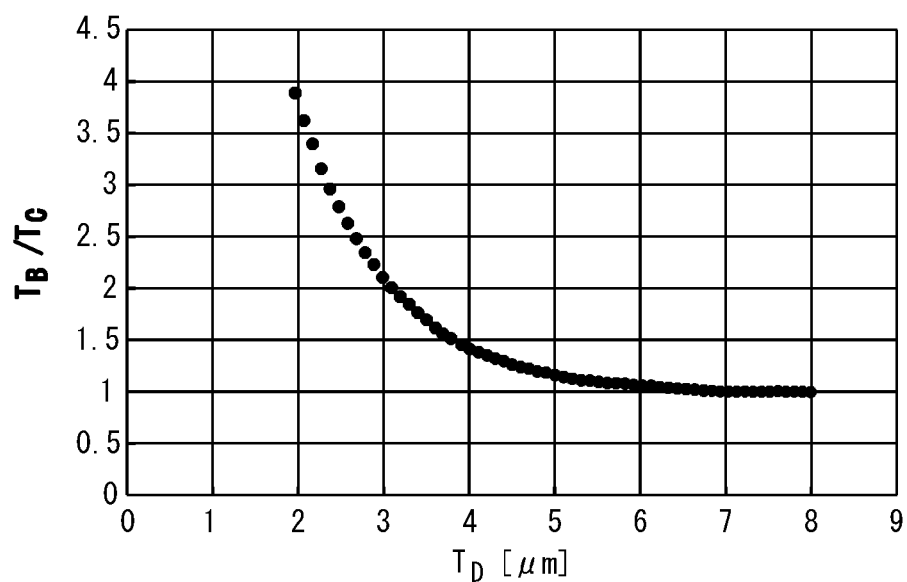
FIG. 13 is a correlation diagram of $T_C/T_B$ with respect to the depth of the trench.

FIG. 13 is a correlation diagram of $T_C/T_B$ with respect to the depth of the trench 12. FIG. 13 indicates relationship between the depth $T_D$ to the bottom portion of the trench 12 and $T_C/T_B$ in a case where variation in the saturated current is 2%. From an approximate curve of data indicated in FIG. 13, the depth $T_C$ of the intersection point 18, the depth $T_B$ of the base layer 24 and the depth $T_D$ of the trench 12 preferably satisfy the following expression (1).

[Math. 1]

$$T_C/T_B \geq 20.563 \times \exp(T_D^{0.973}) + 1 \quad (1)$$

This can make variation in the saturated current equal to or less than 2%. Further, it can be confirmed from FIG. 13 that a ratio of $T_C/T_B$ is closer to 1 as the trench 12 becomes deeper.

Figure 14:
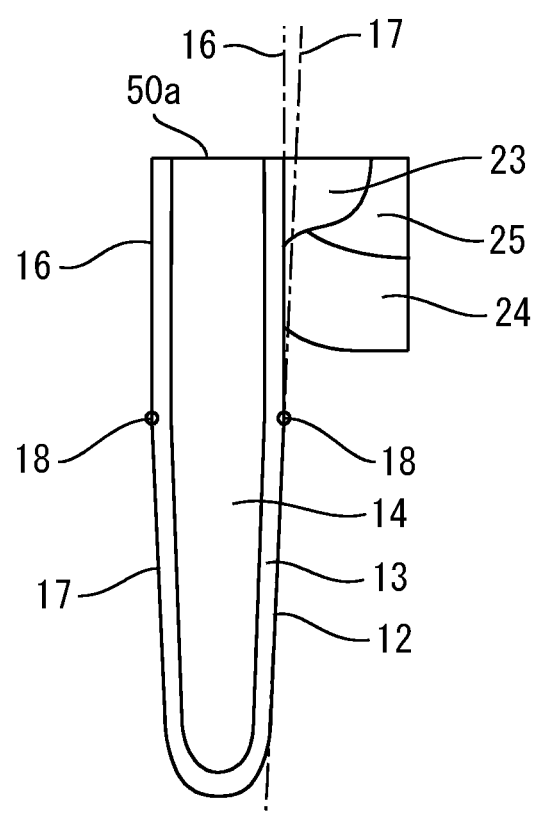
FIG. 14 is a view explaining a structure of the semiconductor device according to the first embodiment.

FIG. 14 is a view explaining a structure of the semiconductor device 100 according to the first embodiment. As illustrated in FIG. 14, in the present embodiment, the intersection point 18 of the first surface 16 and the second surface 17 is positioned below the base layer 24 as an example. As illustrated in FIG. 12, this can reduce variation in the saturated current also in the shallow trench 12. Further, as illustrated in FIG. 13, variation in the saturated current can be sufficiently reduced even if the intersection point 18 is positioned at the same depth as a depth of a lower end of the base layer 24 depending on the depth of the trench 12.

Further, feedback capacity $C_{res}$ of the semiconductor device 100 can be expressed with the following expression (2).

[Math. 2]

$$C_{res} = \left[ W_T - \frac{2(T_D - T_B)}{\tan \theta 2} + 2(T_D - T_B) \right] \times \frac{C_{OX} C_M}{C_{OX} + C_M}$$

Here, $W_T$ is a width of the trench 12, $C_{OX}$ is capacitance of the gate insulating film 13 provided inside the trench 12, and $C_M$ is capacitance of a depletion layer. $W_T$ is a width of the widest portion on the upper surface 50a of the substrate 50 of the trench 12. In the present embodiment, the feedback capacity $C_{res}$ can be reduced by an amount corresponding to a term of $2(T_D-T_B)/\tan \theta 2$ in the expression (2) compared to a U-shaped trench. Thus, the present embodiment can reduce the feedback capacity $C_{res}$. In this manner, the present embodiment can reduce the feedback capacity and reduce variation in the saturated current.

While an example has been described in the present embodiment where the semiconductor device 100 is an IGBT, the semiconductor device 100 may be a MOSFET.

Further, the semiconductor device 100 may be made with a wide band gap semiconductor. The wide band gap semiconductor is, for example, silicon carbide, a gallium-nitride-based material or diamond. In a case where a high current is made to flow in the semiconductor device 100 made with the wide band gap semiconductor, according to the present embodiment, it is possible to prevent decrease in a withstand voltage due to variation in the saturated current. It is therefore possible to effectively utilize performance of the semiconductor device 100.

These modifications can be appropriately applied to semiconductor devices and manufacturing methods of the semiconductor devices according to embodiments below. Meanwhile, for the semiconductor devices and the manufacturing methods of the semiconductor devices according to the embodiments below, dissimilarities with the first embodiment will mainly be explained as they have many similarities with the first embodiment.

Second Embodiment

Figure 15:
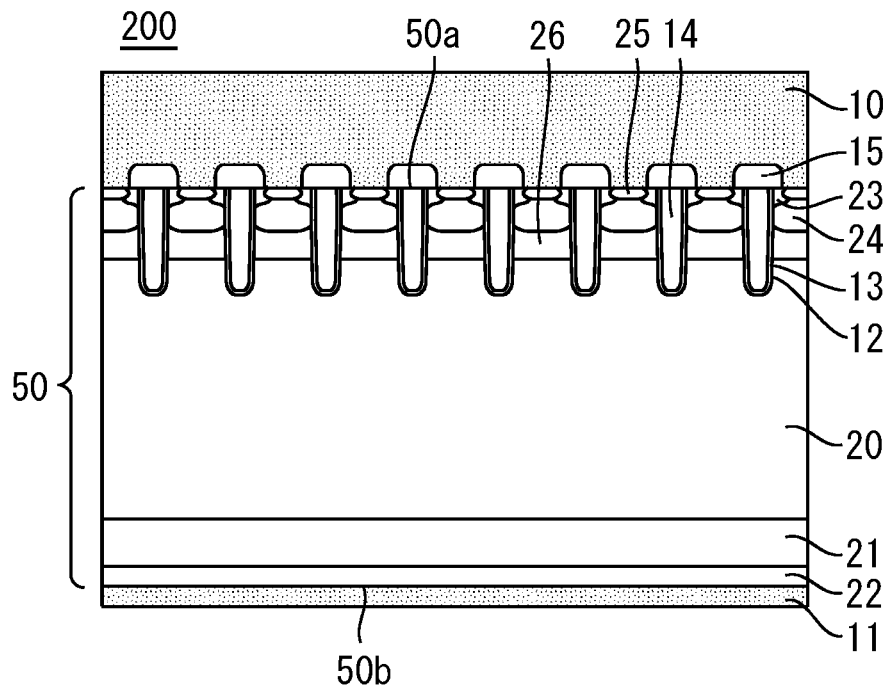
FIG. 15 is a cross-sectional diagram of a semiconductor device according to a second embodiment.

FIG. 15 is a cross-sectional diagram of a semiconductor device 200 according to a second embodiment. The semiconductor device 200 includes a carrier stored layer 26 which is an n-type and which has higher concentration than concentration of the drift layer 20. The carrier stored layer 26 is provided to a position deeper than a position of the base layer 24 on the upper surface 50a side of the drift layer 20. Other configuration is the same as the configuration of the semiconductor device 100.

In the present embodiment, halls supplied from the collector layer 22 upon energization are stored in the carrier stored layer 26. This can lower conductivity and reduce ON resistance.

Third Embodiment

Figure 16:
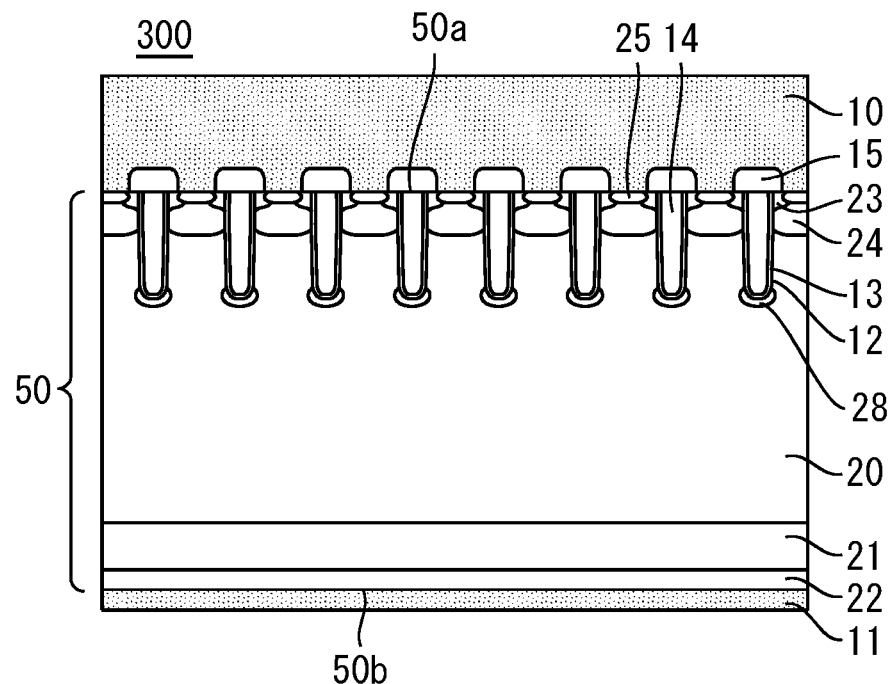
FIG. 16 is a cross-sectional diagram of a semiconductor device according to a third embodiment.

FIG. 16 is a cross-sectional diagram of a semiconductor device 300 according to a third embodiment. The semiconductor device 300 includes a p-type bottom layer 28 provided under the trench 12. Other configuration is the same as the configuration of the semiconductor device 100. The bottom layer 28 can prevent concentration of an electric field at a bottom portion of the trench gate upon switching. It is therefore possible to further improve SOA tolerance.

Fourth Embodiment

Figure 17:
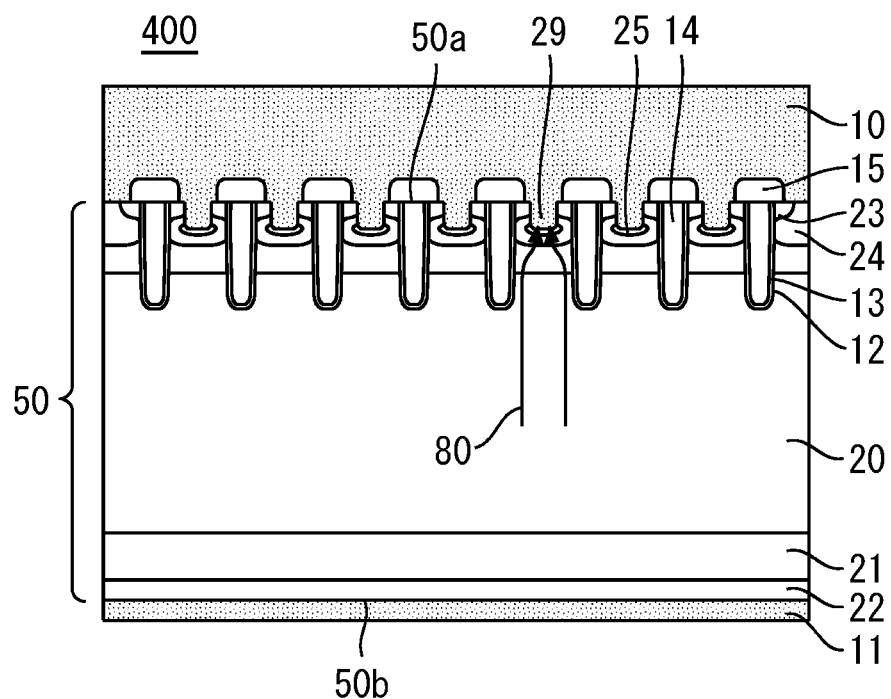
FIG. 17 is a cross-sectional diagram of a semiconductor device according to a fourth embodiment.

FIG. 17 is a cross-sectional diagram of a semiconductor device 400 according to a fourth embodiment. In the semiconductor device 400, the emitter electrode 10 includes trench contacts 29. Each of the trench contacts 29 penetrates through the emitter layer 23 from the upper surface 50a of the substrate 50 between a pair of trenches 12 which are adjacent to each other and protrudes inside the base layer 24. The contact layer 25 is provided so as to contact bottom portions of the trench contacts 29 inside the base layer 24. Other configuration is the same as the configuration of the semiconductor device 100.

In the semiconductor device 400, a collector current does not flow immediately below the emitter layer 23 upon switching of the IGBT and, for example, flows through the trench contacts 29 as indicated with an arrow 80. In other words, the collector current flows through the trench contacts 29 before reaching immediately below the emitter layer 23. This can achieve improvement of latch-up tolerance.

Fifth Embodiment

Figure 18:
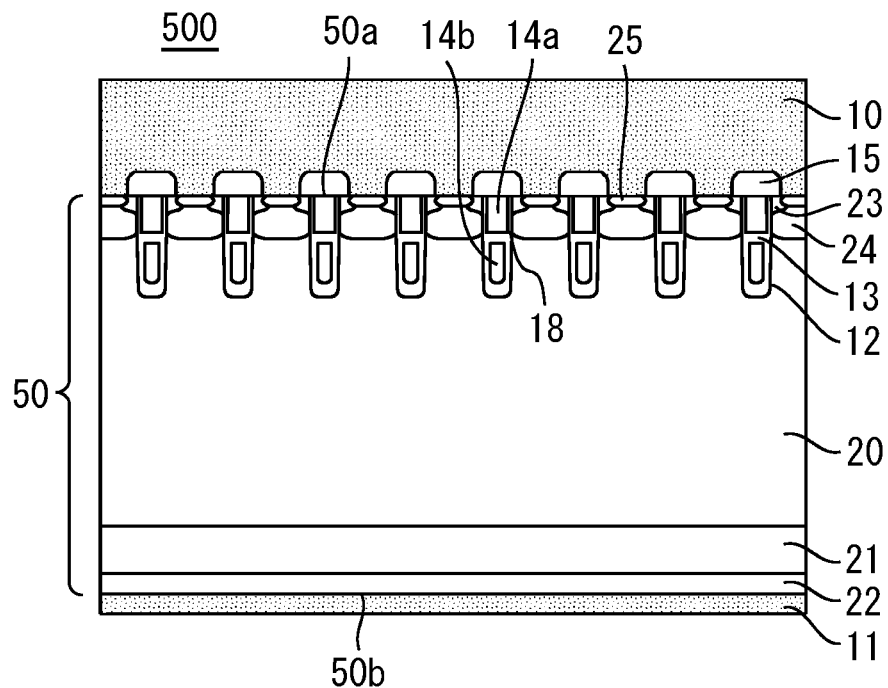
FIG. 18 is a cross-sectional diagram of a semiconductor device according to a fifth embodiment.

FIG. 18 is a cross-sectional diagram of a semiconductor device 500 according to a fifth embodiment. In the semiconductor device 500, a gate electrode includes a first gate electrode 14a and a second gate electrode 14b provided below the first gate electrode 14a via the gate insulating film 13. The first gate electrode 14a is provided above the intersection point 18, and the second gate electrode 14b is provided below the intersection point 18. Other configuration is the same as the configuration of the semiconductor device 100. By applying a two-stage gate structure, a thickness of the gate insulating film 13 is secured, so that the feedback capacity can be reduced.

Sixth Embodiment

Figure 19:
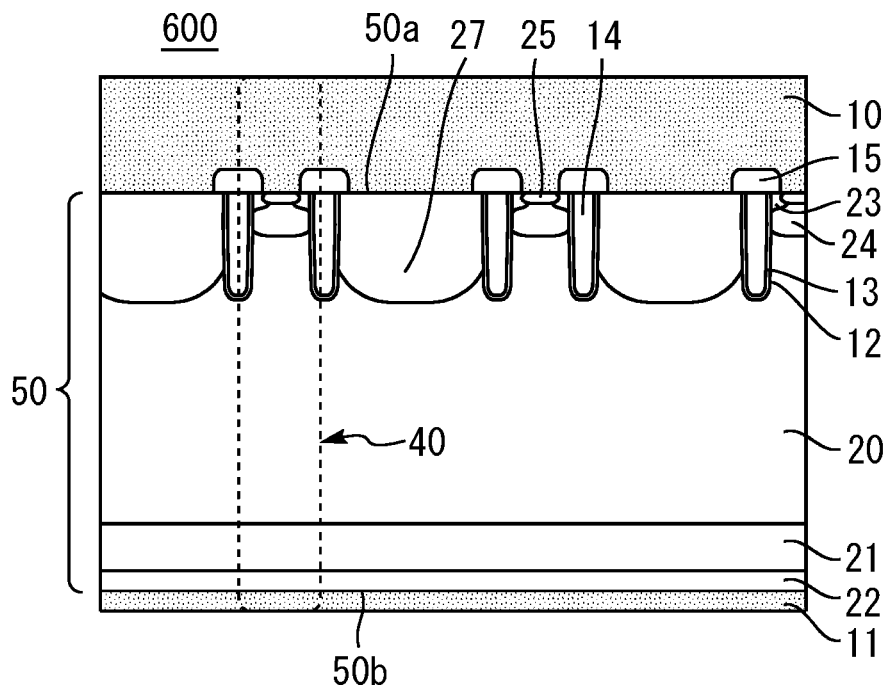
FIG. 19 is a cross-sectional diagram of a semiconductor device according to a sixth embodiment.

FIG. 19 is a cross-sectional diagram of a semiconductor device 600 according to a sixth embodiment. The semiconductor device 600 includes a plurality of trenches 12. The plurality of trenches 12 include a pair of trenches 12 which are adjacent without the base layer 24 and the emitter layer 23 being put between the trenches. A p-type carrier accumulation layer 27 is provided between the pair of trenches 12. Other configuration is the same as the configuration of the semiconductor device 100.

In the present embodiment, the cell regions 40 are thinned out with respect to the first embodiment. This configuration allows halls supplied from the collector layer 22 upon energization to be accumulated in the carrier accumulation layer 27. This can lower conductivity and reduce ON resistance.

In FIG. 19, the cell region 40 and the carrier accumulation layer 27 are alternately provided. The configuration is not limited to this, and the semiconductor device 600 only requires to include at least one portion of a region where the cell regions 40 are thinned out and the carrier accumulation layer 27 is provided.

Seventh Embodiment

Figure 20:
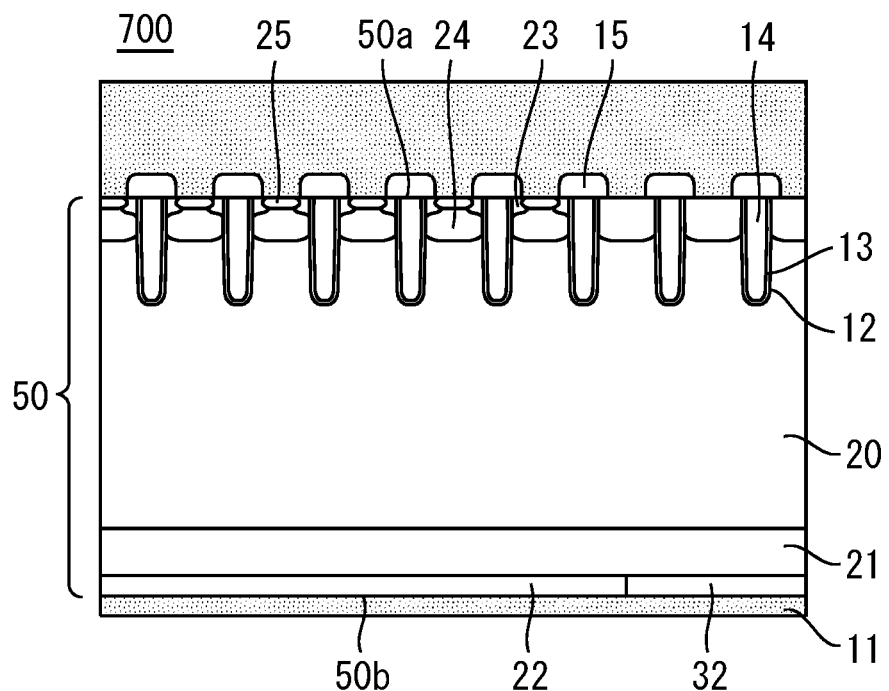
FIG. 20 is a cross-sectional diagram of a semiconductor device according to a seventh embodiment.

FIG. 20 is a cross-sectional diagram of a semiconductor device 700 according to a seventh embodiment. The semiconductor device 700 is a reverse-conducting (RC)-IGBT. In the semiconductor device 700, a diode and an IGBT are formed on the same substrate 50. In a diode region, the collector layer 22 is replaced with an n-type cathode layer 32. Further, the emitter layer 23 and the contact layer 25 are not provided in the diode region. The semiconductor device 700 can also provide effects similar to the effects of the first embodiment.

The technical features described in the foregoing embodiments can be used in various combinations as required.

In a semiconductor device and a manufacturing method of the semiconductor device according to the present disclosure, an intersection point of a first surface and a second surface which tilts inward of a trench with respect to the first surface is provided below a base layer. This can reduce variation in a saturated current.

Obviously many modifications and variations of the present disclosure are possible in the light of the above teachings. It is therefore to be understood that within the scope of the appended claims the disclosure may be practiced otherwise than as specifically described.

The entire disclosure of a Japanese Patent Application No. 2021-017636, filed on Feb. 5, 2021 including specification, claims, drawings and summary, on which the Convention priority of the present application is based, are incorporated herein by reference in its entirety.

The invention claimed is:

1. A semiconductor device comprising:
a substrate including an upper surface and a rear surface on an opposite side of the upper surface;
a drift layer provided on the upper surface side of the substrate and having a first conductivity type;
a base layer provided on the upper surface side of the drift layer and having a second conductivity type different from the first conductivity type;
an upper semiconductor layer provided on the upper surface side of the base layer and having the first conductivity type;
a first electrode provided on the upper surface of the substrate and electrically connected to the upper semiconductor layer;
a second electrode provided on the rear surface of the substrate;
a trench penetrating through the upper semiconductor layer and the base layer from the upper surface of the substrate and extending to the drift layer; and
a gate electrode provided inside the trench, wherein
an inner side surface of the trench has a first surface, a second surface provided below the first surface, and a bottom surface with a curved shape below the second surface,
the second surface tilts inward of the trench with respect to the first surface,
an intersection point of the first surface and the second surface is provided below the base layer, and
a corner portion connects the bottom surface of the trench and the second surface, and the curved shape begins at the corner portion.

2. A semiconductor device comprising:
a substrate including an upper surface and a rear surface on an opposite side of the upper surface;
a drift layer provided on the upper surface side of the substrate and having a first conductivity type;
a base layer provided on the upper surface side of the drift layer and having a second conductivity type different from the first conductivity type;
an upper semiconductor layer provided on the upper surface side of the base layer and having the first conductivity type;
a first electrode provided on the upper surface of the substrate and electrically connected to the upper semiconductor layer;
a second electrode provided on the rear surface of the substrate;
a trench penetrating through the upper semiconductor layer and the base layer from the upper surface of the substrate and extending to the drift layer; and
a gate electrode provided inside the trench, wherein
an inner side surface of the trench has a first surface and a second surface provided below the first surface,
the second surface tilts inward of the trench with respect to the first surface,
an intersection point of the first surface and the second surface is provided below the base layer, and
a depth $T_C$ from the upper surface of the substrate to the intersection point, a depth $T_B$ from the upper surface of the substrate to a lower end of a portion adjacent to the trench, of the base layer, and a depth $T_D$ to a bottom portion of the trench satisfy relationship of

[Math. 1]

$$T_C/T_B \geq 20.563 \times \exp(T_D^{0.973}) + 1 \quad (1)$$

3. The semiconductor device according to claim 1, wherein an angle formed by the first surface and the upper surface of the substrate is greater than 89° and equal to or less than 90°, and an angle formed by the second surface and the upper surface of the substrate is greater than 86° and equal to or less than 88°.

4. The semiconductor device according to claim 1, wherein feedback capacity $C_{res}$ of the semiconductor device, a width $W_T$ of the trench, a depth $T_D$ to a bottom portion of the trench, a depth $T_B$ from the upper surface of the substrate to a lower end of a portion adjacent to the trench, of the base layer, an angle θ formed by the second surface and the upper surface of the substrate, capacitance $C_{ox}$ of a gate insulating film provided inside the trench, and capacitance $C_M$ of a depletion layer satisfy relationship of $$C_{res} = \left[ W_T - \frac{2(T_D - T_B)}{\tan\theta} + 2(T_D - T_B) \right] \times \frac{C_{OX} C_M}{C_{OX} + C_M}. \quad \text{[Math. 2]}$$

5. The semiconductor device according to claim 1, further comprising:
a carrier stored layer provided to a position deeper than a position of the base layer on the upper surface side of the drift layer, having the first conductivity type, and having higher concentration than concentration of the drift layer.

6. The semiconductor device according to claim 1, further comprising:
a bottom layer provided under the trench and having the second conductivity type.

7. The semiconductor device according to claim 1, wherein the first electrode includes a trench contact which penetrates through the upper semiconductor layer from the upper surface of the substrate and protrudes inside the base layer between a pair of the trenches adjacent to each other.

8. The semiconductor device according to claim 1,
wherein the gate electrode includes a first gate electrode and a second gate electrode provided below the first gate electrode via a gate insulating film,
the first gate electrode is provided above the intersection point, and
the second gate electrode is provided below the intersection point.

9. The semiconductor device according to claim 1,
wherein a plurality of the trenches are provided,
the plurality of trenches include a pair of trenches which are adjacent without the base layer and the upper semiconductor layer being put between the trenches, and a carrier accumulation layer having the second conductivity type is provided between the pair of trenches.

10. The semiconductor device according to claim 1, wherein the semiconductor device is an RC-IGBT.

11. The semiconductor device according to claim 1, wherein the substrate is made with a wide band gap semiconductor.

12. The semiconductor device according to claim 11, wherein the wide band gap semiconductor is silicon carbide, a gallium-nitride-based material or diamond.

13. A manufacturing method of a semiconductor device, comprising:
forming a drift layer having a first conductivity type on an upper surface side of a substrate which includes the upper surface and a rear surface on an opposite side of the upper surface;
forming a base layer having a second conductivity type different from the first conductivity type on the upper surface side of the drift layer;
forming an upper semiconductor layer having the first conductivity type on the upper surface side of the base layer;
forming a first trench extending to a depth below the base layer from the upper surface of the substrate through etching;
performing etching from a bottom portion of the first trench to form a second trench under at least one of a condition that a pressure of an etching gas is made higher than a pressure of an etching gas upon formation of the first trench, a condition that an applied voltage of an ion to be used for etching is made lower than an applied voltage of an ion upon formation of the first trench, or a condition that a by-product generated in association with etching is made more likely to be deposited than a by-product generated upon formation of the first trench;
forming a first electrode electrically connected to the upper semiconductor layer on the upper surface of the substrate;
forming a second electrode on the rear surface of the substrate; and
forming a gate electrode inside a trench formed from the first trench and the second trench.

* * * * *